(12) United States Patent
Bao et al.

(10) Patent No.: US 8,723,608 B2
(45) Date of Patent: May 13, 2014

(54) METHOD AND ARRANGEMENT FOR VOLTAGE CONTROLLED OSCILLATOR DEVICE

(75) Inventors: Mingquan Bao, Västra Frölunda (SE); Thomas Per Lewin, Onsala (SE); Yinggang Li, Askim (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 13/127,638

(22) PCT Filed: Nov. 18, 2008

(86) PCT No.: PCT/EP2008/065765
§ 371 (c)(1),
(2), (4) Date: May 4, 2011

(87) PCT Pub. No.: WO2010/057520
PCT Pub. Date: May 27, 2010

(65) Prior Publication Data
US 2011/0215876 A1   Sep. 8, 2011

(51) Int. Cl.
*H03B 5/12* (2006.01)
(52) U.S. Cl.
USPC .......................................... 331/48; 331/117 R
(58) Field of Classification Search
USPC .................................. 331/48, 117 R
See application file for complete search history.

(56) References Cited

U.S. PATENT DOCUMENTS 7,863,987 B2 *  1/2011  Kanda et al. ..................... 331/2
7,961,056 B2 *  6/2011  Taylor et al. .................... 331/48

FOREIGN PATENT DOCUMENTS

EP    1713182 A1    10/2006

OTHER PUBLICATIONS

Heng-Chia Chang: "Stability analysis of self-injection-locked oscillator", IEEE Trans. on Microwave Theory and Technique, vol. 51, No. 9, pp. 1989-1993, Sep. 2003.
K. Kurokawa: "Injection locking of microwave solid-state oscillator", Proc. of the IEEE, vol. 61, No. 10, pp. 1386-1410, Oct. 1973.
Wang, et al: "Phase-noise reduction of X-band push-push oscillator with second-harmonic self-injection techniques", IEEE Trans. on Microwave Theory and Technique, 2006.
Rohde, et al: "Low cost configurable RF signal source for wireless applications", Proceedings of the 37th European Microwave Conference, 2007.
Chang: "Phase noise in self-injection-locked oscillators-theory and experiment", IEEE Trans. on Microwave Theory and Technique, vol. 51, No. 9, pp. 1994-1999, Sep. 2003.
Mingquan, et al: "A Compact 23 GHz Hartley VCO in 0.13 m CMOS Technology". Oct. 27, 2008. XP031417083.

* cited by examiner

*Primary Examiner* — Joseph Chang

(57) ABSTRACT

Embodiments of the present invention relate to a self injection locked voltage controlled oscillator arrangement, a pair of coupled first and second voltage controlled oscillator devices are arranged on a chip, an amplifier device is arranged on the same of the refection type chip, and an off-chip delay line is arranged with one terminal connected to an output terminal of the coupled first and second voltage controlled oscillator devices, and on terminal adapted to reflect a signal from the output terminal, the amplifier device being arranged to amplify an injection signal from said output terminal and to supply the amplified injection signal to one of said first and second voltage controlled oscillation devices to provide a VCO arrangement that exhibits low phase noise and a small size.

5 Claims, 5 Drawing Sheets

METHOD AND ARRANGEMENT FOR VOLTAGE CONTROLLED OSCILLATOR DEVICE

TECHNICAL FIELD

The present invention concerns voltage controlled oscillators in general, and specifically an improved self-injection locked voltage controlled oscillator.

BACKGROUND

As one of the key components in RF front-end devices, a voltage controlled oscillator (VCO) with low phase noise is highly demanded. Injection locking is a technique that is used to reduce the phase noise [1]-[4] of a VCO. It is a type of forced oscillation where a signal is injected into the oscillator and "locks" the oscillator to the frequency and phase of the injected signal under proper conditions.

Self-injection locking is a special type of the injection locking technique, where the injected signal comes from the oscillator itself instead of from an external source. An early self-injection-locking arrangement is shown in FIG. 1, [2], where a circulator is used to direct the signal propagation in a desired way [2]. T. P. Wang et al proposed another self-injected push-push oscillator [3]. In their implementation, the second harmonic signal of the oscillator arrangement is used for self-injection locking. Recently, U. L. Rohde and A. K. Poddar proposed a self-injection locking setup based on two coupled VCOs, where the output signal from one VCO is injected into the other.

European Patent Application EP 1713182 discloses an oscillator array with a plurality of series-connected oscillators, and at least one band elimination filter, which is disposed between respective adjacent two of the oscillators. In addition, a synchronization method for oscillator array is disclosed, in which a signal generated from each of the oscillators is in phase with a signal reflected by corresponding band elimination filter at elimination frequencies of the band filter, and in opposite phase with signals leaked from corresponding band elimination filters.

In the above-mentioned known solutions, the output signal is split into two and one of them is delayed via signal propagation through the delay line and then is injected into the oscillator. The delay must be sufficiently long, so that the delayed signal is uncorrelated with the un-delayed signal [1, 5]. Typically, several nano seconds delay is required for GHz oscillators. This makes it difficult to implement the delay line on a substrate, such as Si or glass substrate, since the resulting component would be too large and too costly.

SUMMARY

As described above, one problem with the above-mentioned solutions is the large substrate area consumed by the delay line, and consequently of the entire oscillator device. Thus, shortening the delay line becomes a practical issue for self-injection locked VCOs.

An object of the present invention is thus to provide a self-injection oscillator device with reduced length of the delay line.

Basically, an improved self injection locked voltage controlled oscillator arrangement (1) comprises a pair of coupled first and second voltage controlled oscillator devices (21, 22) arranged on a chip (2), an amplifier device (23) arranged on said chip (2), and an off-chip delay line (10) arranged with one terminal connected to an output terminal of said coupled first and second voltage controlled oscillators (21, 22), and one terminal adapted to reflect a signal from said output terminal, to provide an improved VCO arrangement (1).

Advantages of the present invention include
An enhanced self-injection signal
A shortened delay line
Reduced oscillator arrangement size.

BRIEF DESCRIPTION OF THE DRAWINGS

The invention, together with further objects and advantages thereof, may best be understood by referring to the following description taken together with the accompanying drawings, in which.

ABBREVIATIONS

CMOS Complementary Metal Oxide Semiconductor transistor
RF Radio Frequency
VCO Voltage controlled oscillator

DETAILED DESCRIPTION

In the present disclosure, embodiments of a novel arrangement for a self-injection-locked VCO are disclosed.

Figure 1:
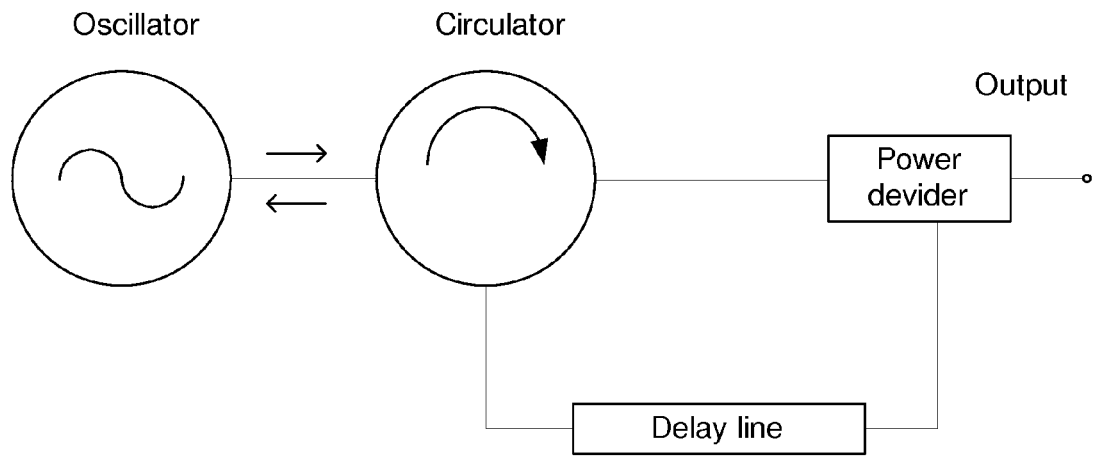
FIG. 1 is an illustration of a known self-injection locked voltage controlled oscillator.
Figure 2:
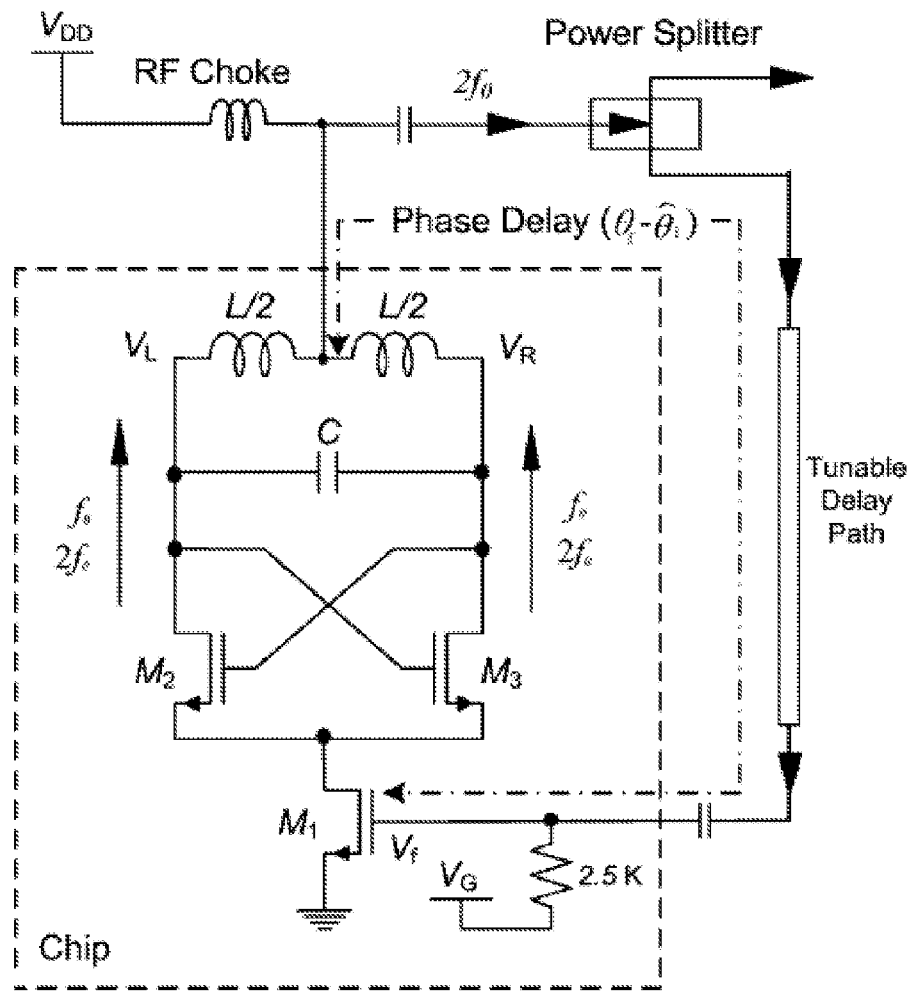
FIG. 2 is an illustration of a known self-injection locked voltage controlled oscillator.
Figure 3:
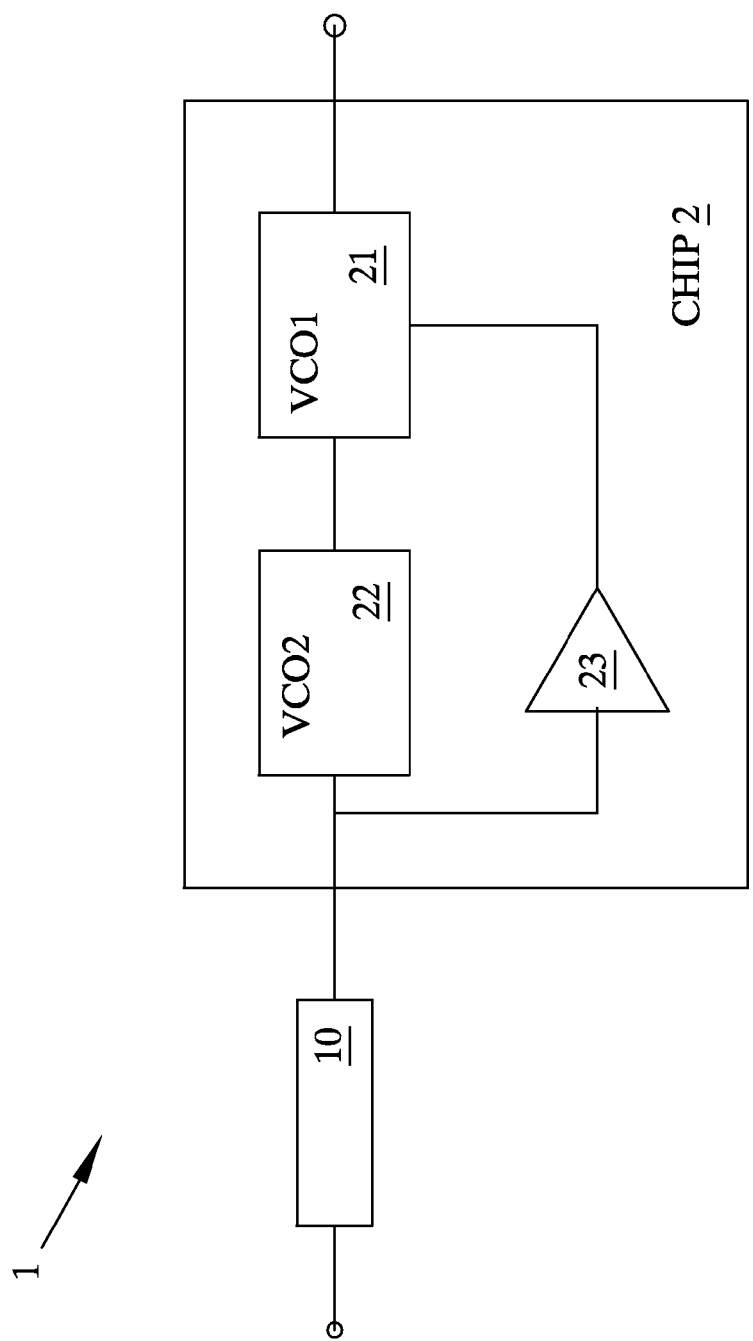
FIG. 3 is an illustration of an embodiment of an arrangement according to the present invention.
Figure 4:
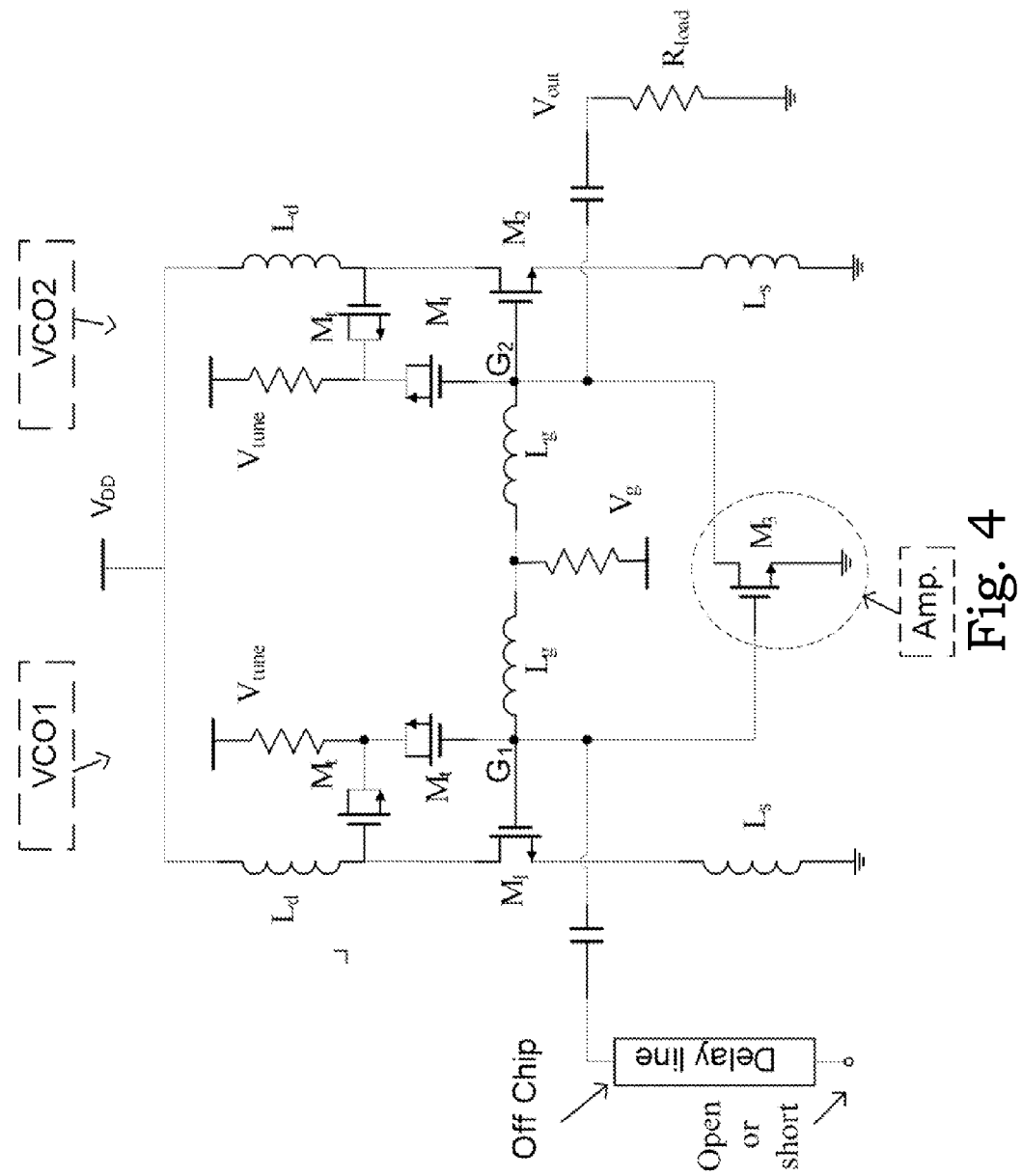
FIG. 4 is an illustration of an embodiment of an arrangement according to the present invention.

With reference to FIG. 4, a basic embodiment of a self-injection locked voltage controller oscillator 1 according to the present invention comprises a coupled VCO pair 21, 22, an integrated amplifier 23 and a delay line 10, as shown in FIG. 3. The coupled VCO pair 21, 22 and the amplifier is all arranged on a common substrate or chip 2, whereas the delay line 10 is arranged separate from the substrate 2.

The phase noise of an injection locked VCO depends on the amplitude of the injection signal and the delay time, which near the carrier frequency is given by [5]:

$$\lim_{\varpi_m \to 0} |\tilde{\delta\theta}| \to \frac{|\tilde{\delta\theta}_0|^2}{\left(1 + \frac{A_{inj}}{A} \frac{\varpi_0}{2Q} T\right)^2} \quad (1)$$

Where $A_{inj}$ and $A$ denote the amplitude of the VCO signal with and without self-injection, respectively. Similarly, $|\tilde{\delta\theta}|$ and $|\tilde{\delta\theta}_0|$ denote the phase noise spectra in the two cases, respectively; $T$ is the delay time; $\varpi_0$ is the oscillation frequency and Q is the quality factor of resonator arrangement. From Equation (1) it can be seen that to achieve the same amount of phase noise reduction by self-injection technique, increasing the amplitude of injection signal may release the requirement for delay time, namely, shorten the delay line. Therefore, in the proposed arrangement of FIG. 3, the on-chip amplifier is integrated with the VCO to boost the strength of the injection signal.

Furthermore, as shown in FIG. 3, one terminal of the delay line 10 is connected with one output port of the coupled oscillator pair 21, 22, and the other terminal is electrically shorted or opened to reflect the signal back to the same VCO's port. This kind of delay line 10 is called a reflection-type delay line, which has twice of the delay time as the propagation-type delay line used in previous self-injection oscillators. In other words, the line length can be shortened by 50% using the disclosed reflection type delay line.

A hybrid solution may be used to implement the proposed arrangement. A self-injection-locked VCO module 1, for instance, can be built using semiconductor chip consisting of a coupled VCO pair 21, 22, with an integrated amplifier 23 and an off-chip delay line 10 built on a separate substrate. The chip 2 and the substrate may be interconnected either by bounded wires or flip-chip bumps, or some other connection means.

It is evident that the above described technique is not limited to any particular type of oscillators; therefore a few variants of embodiments are disclosed and discussed below.

With reference to FIG. 4, an embodiment of the present invention will be described. As discussed above, it is beneficial that an amplifier is utilized to enhance the injected signal and consequently shorten the delay line (to achieve a given amount of phase noise reduction). In FIG. 4, an amplifier M3 is included on the chip. Its gate is connected with the output port of one of the oscillator units VCO1 and its drain is connected with the other oscillator unit VCO2, namely, the gate of transistor M2. The signal reflected from delay line is injected both into VCO1 at a node G1 and into VCO2 at a node G2, after being amplified first through the added amplifier. It is important that the phase of amplified signal is as close as possible to that of oscillation signal at VCO2. Otherwise, the self-injection locking will be ineffective. In the proposed circuit, as shown in FIG. 4, the signals at the two gates of the VCO, G1 and G2 are nearly in anti-phase. The phase difference between the gate and the drain of the amplifier transistor, M3 is also almost 180 degrees. This guarantees automatically that the phase relationship is satisfied.

Figure 5:
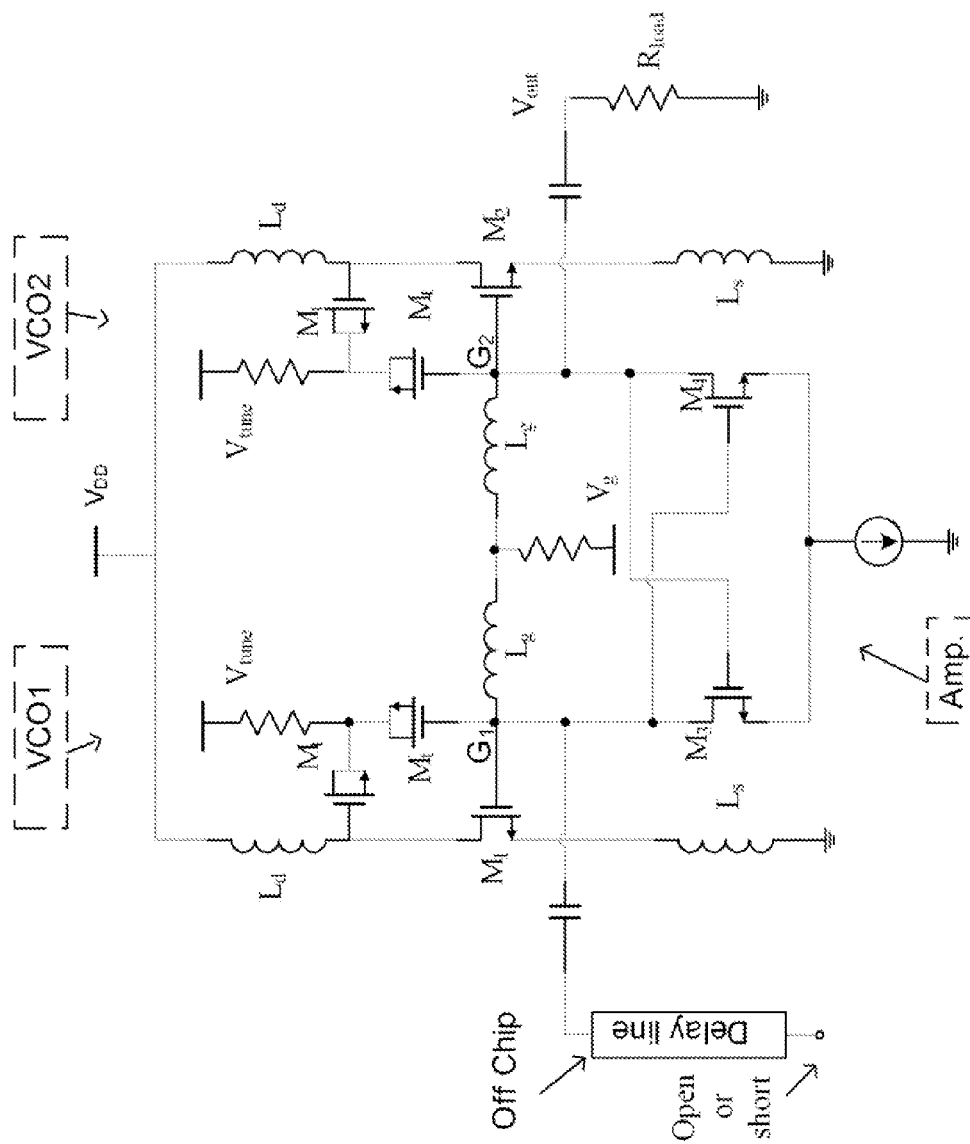
FIG. 5 is an illustration of an embodiment of an arrangement according to the present invention.
Figure 6:
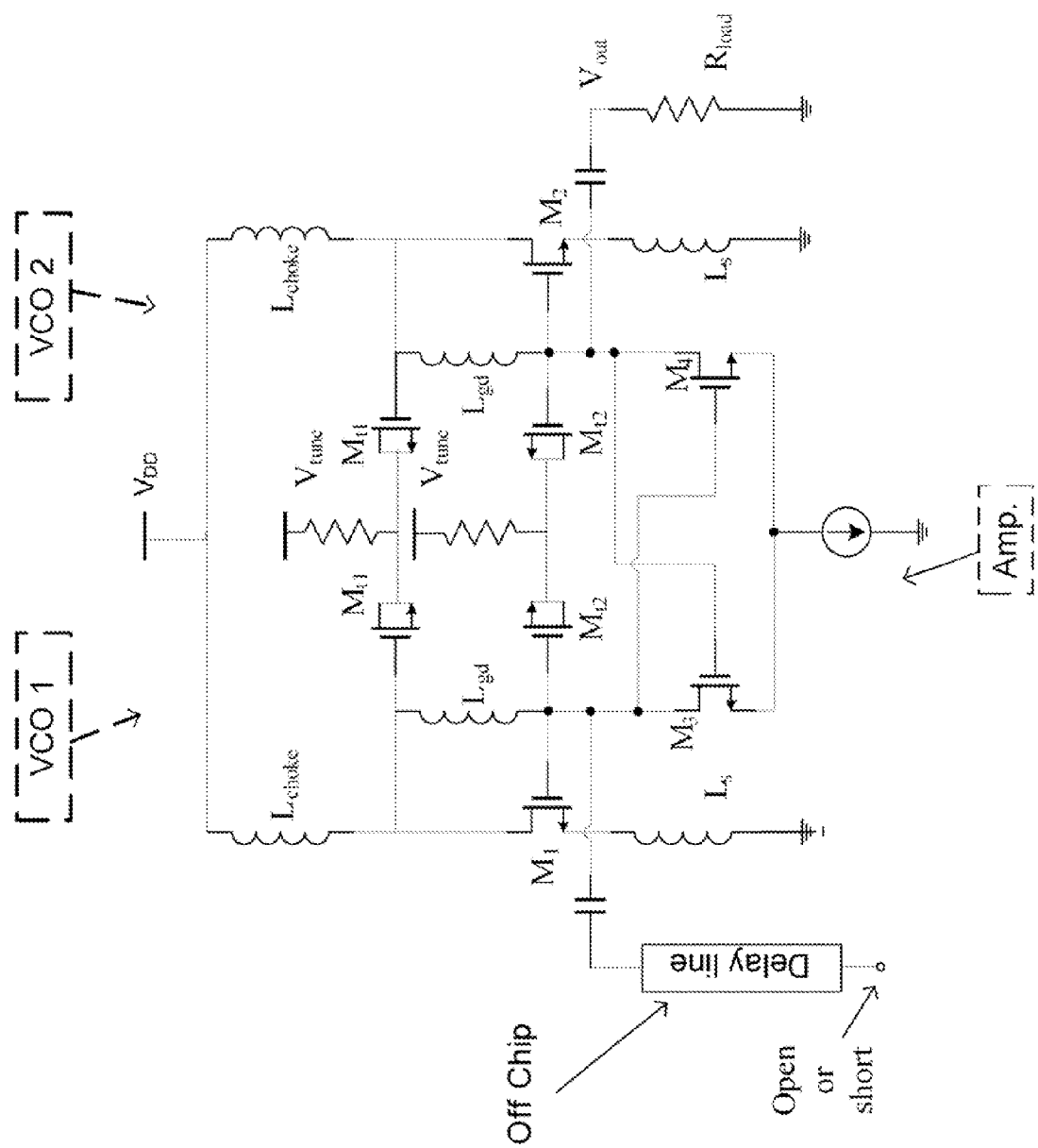
FIG. 6 is an illustration of an embodiment of an arrangement according to the present invention.

In order to make the above described circuit more symmetric, a source-coupled transistor pair can be applied to form a differential amplifier, as shown in the embodiment of FIG. 5.

Finally, it should be emphasized that the proposed self-injection VCO is not limited to the Hartley VCO topology. In principle, any type of VCOs may be applicable.

By implementing the above mentioned combination of on-chip coupled oscillators, on-chip amplifier, and off chip reflective type delay line a number of key features are achieved, as well as a plurality of advantageous properties.

In summary, a pair of coupled VCOs is integrated with either a single-ended or a differential amplifier to provide an improved self-injection-locked oscillator configuration. The integration of the amplifier boosts the power level of the injected signal without necessarily requiring any additional discrete components, The short/open termination or reflective adaptation of the delay line eliminates the need of a circulator (and potentially a power splitter as well) when the feedback signal is preferred to be injected into the VCO at the same port as the outgoing signal, as in ref [1]-[2]. Finally, as compared to the conventionally used propagation-type delay line, the reflection-type delay of the present invention practically shortens the required delay-line length by half.

Advantages of the present invention comprise:
1. An enhanced self-injection signal and consequently, a relatively short delay line is found to be effective in phase noise reduction.
2. Using the reflection type delay line, the length of the line is only a half of what is required by using the propagation type delay line (for the same time delay).
3. Since the delay line is critical for the size of the substrate, thus, the size of the module, the proposed implementation can reduce the module size significantly.

The improved self-injection locked VCO according to the present invention can be implemented in any semiconductor technology, e.g. Si (CMOS, bipolar), GaAs (HBT, HEMT), etc.

It will be understood by those skilled in the art that various modifications and changes may be made to the present invention without departure from the scope thereof, which is defined by the appended claims.

REFERENCES

[1] Heng-Chia Chang, "Stability analysis of self-injection-locked oscillator", IEEE Trans on Microwave Theory and Technique, Vol. 51, No. 9, pp. 1989-1993, September, 2003.
[2] K. Kurokawa, "Injection locking of microwave solid-state oscillator", Proc. Of IEEE, vol 61, no, 10, pp. 1386-1410, October, 1973.
[3] T. P. Wang, Z. M. Tsai, K. J. Sun and H. Wang, "Phase-noise reduction of X-band push-push oscillator with second-harmonic self-injection techniques", IEEE Trans. on Microwave Theory and Technique, 2006.
[4] U. L. Rohde and A. K. Poddar, "Low cost configurable RF signal source for wireless applications", Proceedings of the 37th European Microwave Conference, 2007.
[5] Heng-Chia Chang, "Phase noise in self-injection-locked oscillators theory and experiment", IEEE Trans of Microwave Theory and Technique, Vol 51, No 9, pp. 1994-1999, September 2003.

The invention claimed is:

1. A self injection locked voltage controlled oscillator arrangement, comprising:
a pair of coupled first and second voltage controlled oscillator devices arranged on a chip, wherein the first and second voltage controlled oscillator devices are coupled in series,
an amplifier device arranged on said chip, and
an off-chip delay line arranged with one terminal connected to an output terminal of said coupled first and second voltage controlled oscillators and to said amplifier device, and one terminal adapted to reflect a signal from said output terminal, wherein said amplifier device is coupled in parallel to both said first and second voltage controlled oscillator devices to amplify an injection signal from said output terminal and to supply the amplified injection signal to one of said first and second voltage controlled oscillator devices, to provide an VCO arrangement with low phase noise and reduced size.

2. The arrangement according to claim 1, wherein said delay line is a reflection type delay line.

3. The arrangement according to claim 1, wherein said amplifier device is adapted to increase the amplitude of a signal injected into said first voltage controlled oscillator device.

4. The arrangement according to claim 1, wherein said coupled voltage controlled oscillators comprises of coupled Hartley or Colpitts VCOs.

5. The arrangement according to claim 4, wherein said amplifier device comprises of a single ended amplifier or a differential amplifier.

\* \* \* \* \*